United States Patent
Chou et al.

(10) Patent No.: US 7,846,345 B2
(45) Date of Patent: Dec. 7, 2010

(54) METHOD OF MANUFACTURING AN IMPRINTING TEMPLATE USING A SEMICONDUCTOR MANUFACTURING PROCESS AND THE IMPRINTING TEMPLATE OBTAINED

(75) Inventors: Pei-Yu Chou, Tainan County (TW); Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 825 days.

(21) Appl. No.: 11/669,168

(22) Filed: Jan. 31, 2007

(65) Prior Publication Data

US 2008/0182070 A1    Jul. 31, 2008

(51) Int. Cl.
*C03C 15/00* (2006.01)
*C03C 25/68* (2006.01)
*C23F 1/00* (2006.01)

(52) U.S. Cl. .................... 216/41; 216/11; 216/44; 216/56; 438/694

(58) Field of Classification Search .............. 216/41, 216/44, 11, 54, 56; 438/694
See application file for complete search history.

(56) References Cited

U.S. PATENT DOCUMENTS

| 5,550,085 | A | * | 8/1996 | Liu | 438/299 |
| 5,772,905 | A | | 6/1998 | Chou | |
| 6,387,787 | B1 | * | 5/2002 | Mancini et al. | 438/586 |
| 2002/0115002 | A1 | | 8/2002 | Bailey | |
| 2003/0205657 | A1 | | 11/2003 | Voisin | |
| 2004/0023162 | A1 | * | 2/2004 | Hasegawa et al. | 430/320 |

FOREIGN PATENT DOCUMENTS

JP      P2006326724 A    12/2006

* cited by examiner

*Primary Examiner*—Roberts Culbert
(74) *Attorney, Agent, or Firm*—Winston Hsu; Scott Margo

(57) ABSTRACT

The method of manufacturing an imprinting template according to the present invention utilizes a semiconductor manufacturing process and comprises a step of etching an oxide layer having a thickness of from 1000 to 8000 angstroms on a substrate by a microlithography and etching process, to form a pattern having a plurality of pillar-shaped holes, thereby forming an imprinting plate having a plurality of pillar-shaped holes. A material layer may be filled into the holes and a part of the oxide layer is removed to form an imprinting template having a plurality of pillar-shaped protrusions. Alternatively, a silicon substrate may be used instead of the substrate and the oxide layer. The imprinting template according to the present invention has advantages of mass production, fast production, and low cost, and is suitable to serve as the imprinting plate for making photonic crystals.

16 Claims, 16 Drawing Sheets

METHOD OF MANUFACTURING AN IMPRINTING TEMPLATE USING A SEMICONDUCTOR MANUFACTURING PROCESS AND THE IMPRINTING TEMPLATE OBTAINED

BACKGROUND OF THE INVENTION

1. Field of the Invention

The present invention relates to a manufacturing method of imprinting template and the imprinting template thus manufactured, and particularly to a manufacturing method of imprinting template using a semiconductor manufacturing process and the imprinting template thus manufactured.

2. Description of the Prior Art

Nanoimprint techniques are directed to microlithography techniques to form features having a line width below 100 nm. The various nanoimprint techniques can be categorized into three main categories: nanoimprint lithography (NIL), step and flash imprinting lithography (SFIL), and soft lithography. In the nanoimprint lithography technique, a large area of nano structure can be imprinted by a hot press method. In the step and flash imprinting lithography technique, the nano pattern can be formed by exposure with UV light at room temperature. In the soft lithography technique, the concepts of Top-Down and Bottom-Up are combined and a pattern with a curvature can be transferred using a flexible template. An imprinting template is needed in the nanoimprint techniques. Conventional imprinting templates may be made by direct writing with electron beam (or E-beam), X-ray lithography, or ion beam lithography. However, a pattern with a high aspect ratio (deep profile) is not easily obtained using aforesaid techniques; moreover when a pattern with a high aspect ratio is intended to obtain, the pitch of the features have to be increased. Furthermore, using e-beam to directly write a pattern on an imprinting template is very time-consuming and costly. Recently, it has been known that the pitch of the pattern can be attained from 200 to 410 nm, after development inspect critical dimension (ADICD) is 130 to 250 nm, and the depth is 6000 to 7000 angstroms.

In other respect, in recent years, there have been some practices of LED devices using a photonic crystal structure. For increasing the light emission from the axial direction, a surface roughening process is performed in an LED manufacturing process; however, since the roughened surface situation is not controllable, dissipation of some emitted light still cannot be avoided and the efficiency of light emitting is damaged. Accordingly, the photonic crystal structure is used to increase light-emitting efficiency. A photonic crystal is broadly defined as a material having optic properties periodically changed. For example, small balls having a low refractive index are periodically arranged in a background material having a high refractive index, similar to atoms forming a solid crystal in a regularly and periodically arranged structure. FIG. 1 shows a schematic cross sectional view illustrating a conventional LED device having a photonic crystal structure located on the surface. The LED device comprises a substrate 10, cladding layers 12 and 14, and an active layer 16. The upper surface of the cladding layer 14 has a photonic crystal structure.

Generally, the manufacturing approach for such kind of photonic crystal may simply use, for example, a machinery drilling. While considering the frequency band of visible light or near infrared ray, a nanoscaled fabricating process is used. There are two main methods for making the nanoscaled photonic crystals. One utilizes the self-assembly of colloidal particles, and another one utilizes the lithography combined with etching process to make a lithographic mask and etch the substrate surface through the lithographic mask to form the photonic crystal.

Therefore, there is still a need for methods of manufacturing nanoscaled imprinting templates for making imprinted articles in sub-micro or nano dimension conveniently and economically.

SUMMARY OF THE INVENTION

The objective of the present invention is to provide a method of manufacturing an imprinting template, which uses a semiconductor manufacturing process to manufacture an imprinting template conveniently, fast, and economically, and especially an imprinting template having a deep profile in nano dimension can be obtained.

The method of manufacturing an imprinting template using a semiconductor manufacturing process according to the present invention comprises steps as follows. First, a substrate is provided. Next, an oxide layer having a thickness in a range of 1000 angstroms to 8000 angstroms is formed on the substrate. A photoresist layer is formed on the oxide layer. Thereafter, a microlithography and etch process is performed on the photoresist layer to form a pattern having a plurality of contact hole-like openings. Subsequently, the oxide layer is etched through the openings to form a plurality of pillar-shaped holes. Finally, the photoresist layer is removed, thereby forming an imprinting template having a plurality of pillar-shaped holes.

According to another embodiment of the present invention, the method of manufacturing an imprinting template using a semiconductor manufacturing process comprises steps as follows. First, a substrate is provided. Next, an oxide layer having a thickness in a range of 1000 angstroms to 8000 angstroms is formed on the substrate. A photoresist layer is formed on the oxide layer. Thereafter, a microlithography and etch process is performed on the photoresist layer to form a pattern having a plurality of contact hole-like openings. Subsequently, the oxide layer is etched through the openings to form a plurality of pillar-shaped holes. Thereafter, the photoresist layer is removed. A material is filled into the pillar-shaped holes. Finally, the oxide layer is partly removed, and thereby an imprinting template having a plurality of pillars is formed.

In another aspect of the present invention, the imprinting template using a semiconductor manufacturing process according to the present invention comprises a substrate and an oxide layer on the substrate. The oxide layer has a thickness in a range of 1000 angstroms to 8000 angstroms and comprises a plurality of pillar-shaped holes.

According to another embodiment of the present invention, the imprinting template made by a semiconductor manufacturing process comprises a substrate, an oxide layer on the substrate, and a plurality of pillars penetrating the oxide layer and protruding the oxide layer.

In the embodiment mentioned above, a silicon substrate may be used instead of the substrate and the oxide layer stacked together.

Compared with the conventional manufacturing technology to imprinting template, the method according to the present invention uses semiconductor manufacturing technologies to make imprinting templates, such that a pattern with extruding or concaving features formed can be with a deep profile, and, especially, an imprinting template of sub-micro or nano dimension can be made quickly, in a low cost, and in mass production. The pattern on the imprinting template to be transferred to the small device may be customized as desired according to the device pattern. With respect to manufacturing a structure having a periodic pattern arrangement (for example, the photonic crystal), such as the photonic crystal structure used in LED devices, the method according to the present invention is also suitable to make the imprinting template for making the photonic crystal structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
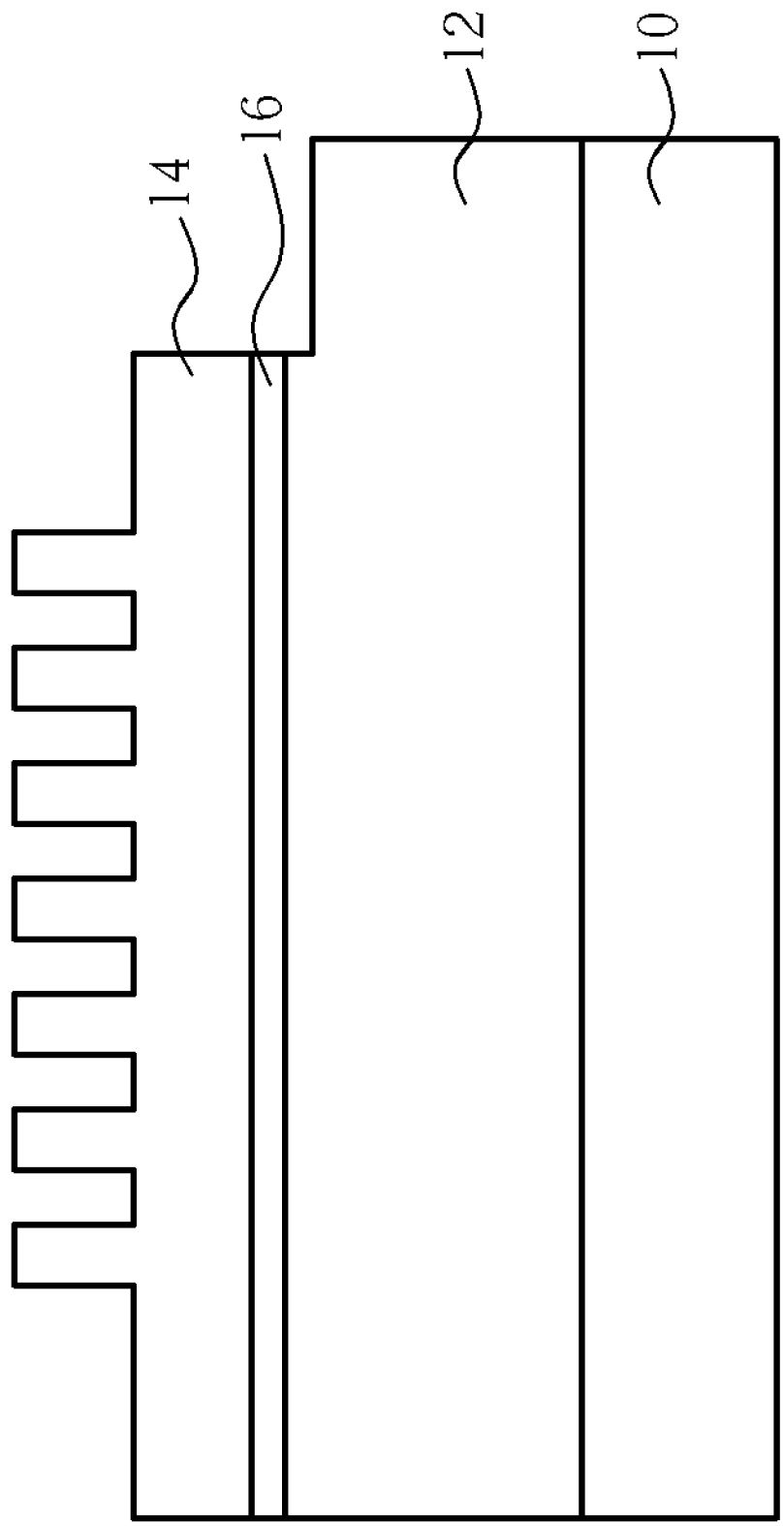
FIG. 1 shows a schematic cross sectional view illustrating a conventional LED device having a photonic crystal structure located on the surface.
Figure 2:
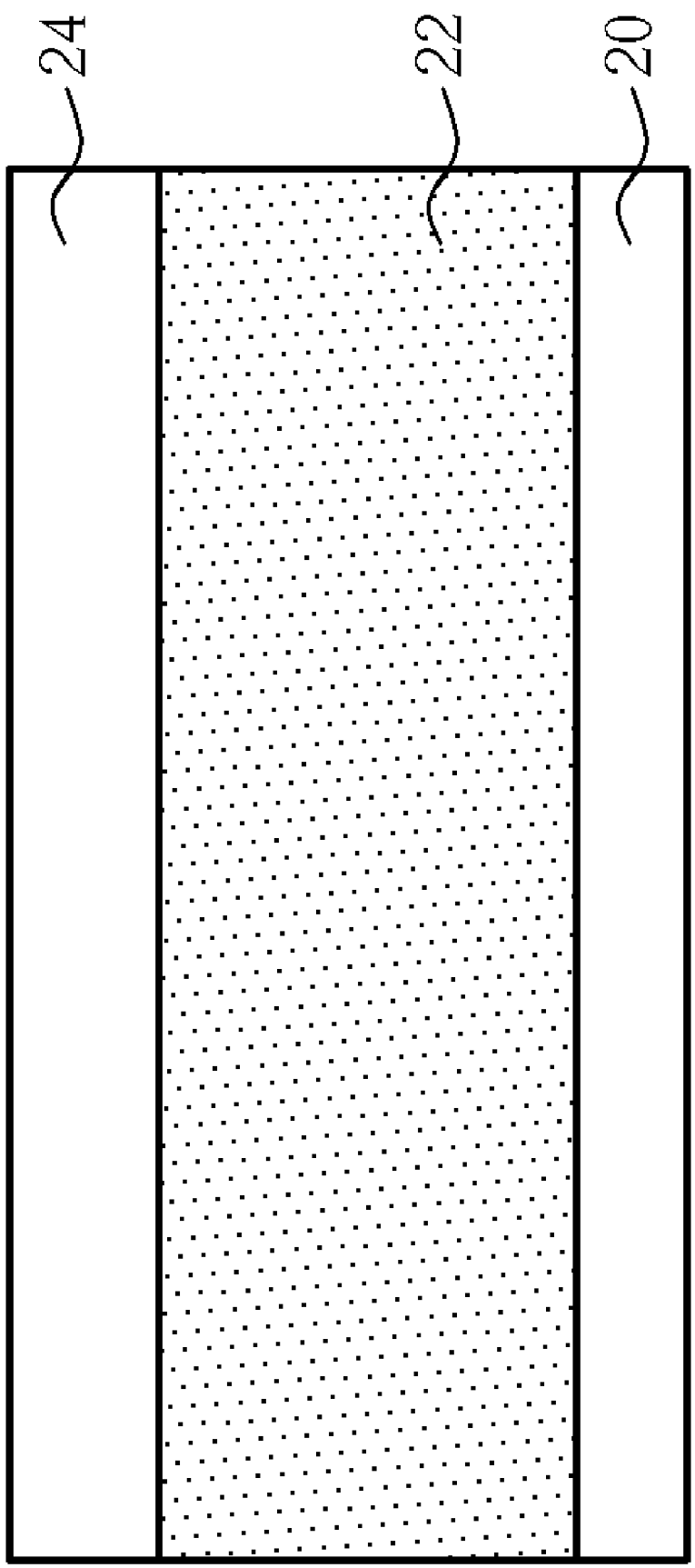
FIGS. 2 to 4 show one embodiment of the method of manufacturing an imprinting template using a semiconductor manufacturing process according to the present invention.
Figure 3:
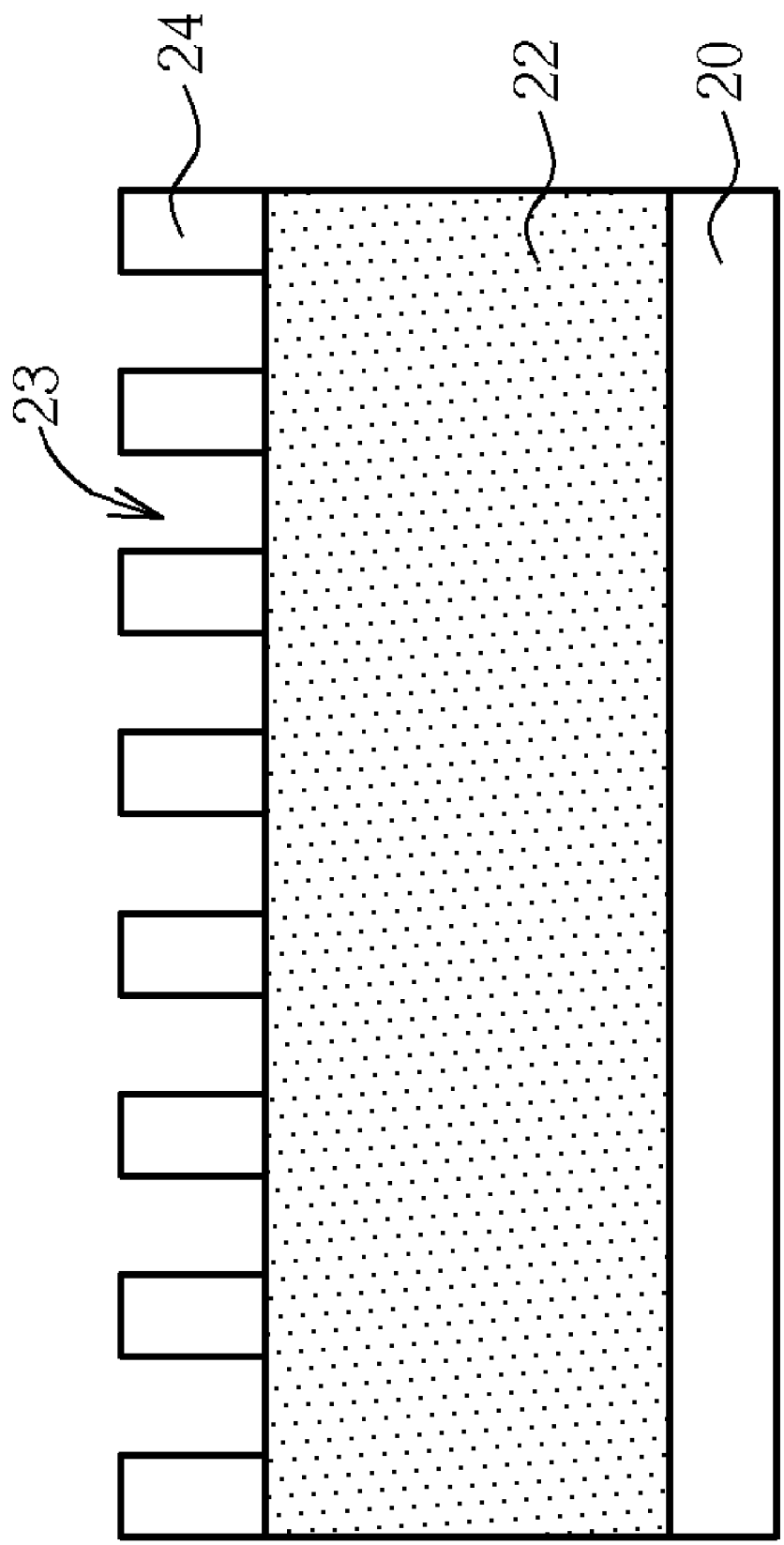
Figure 4:
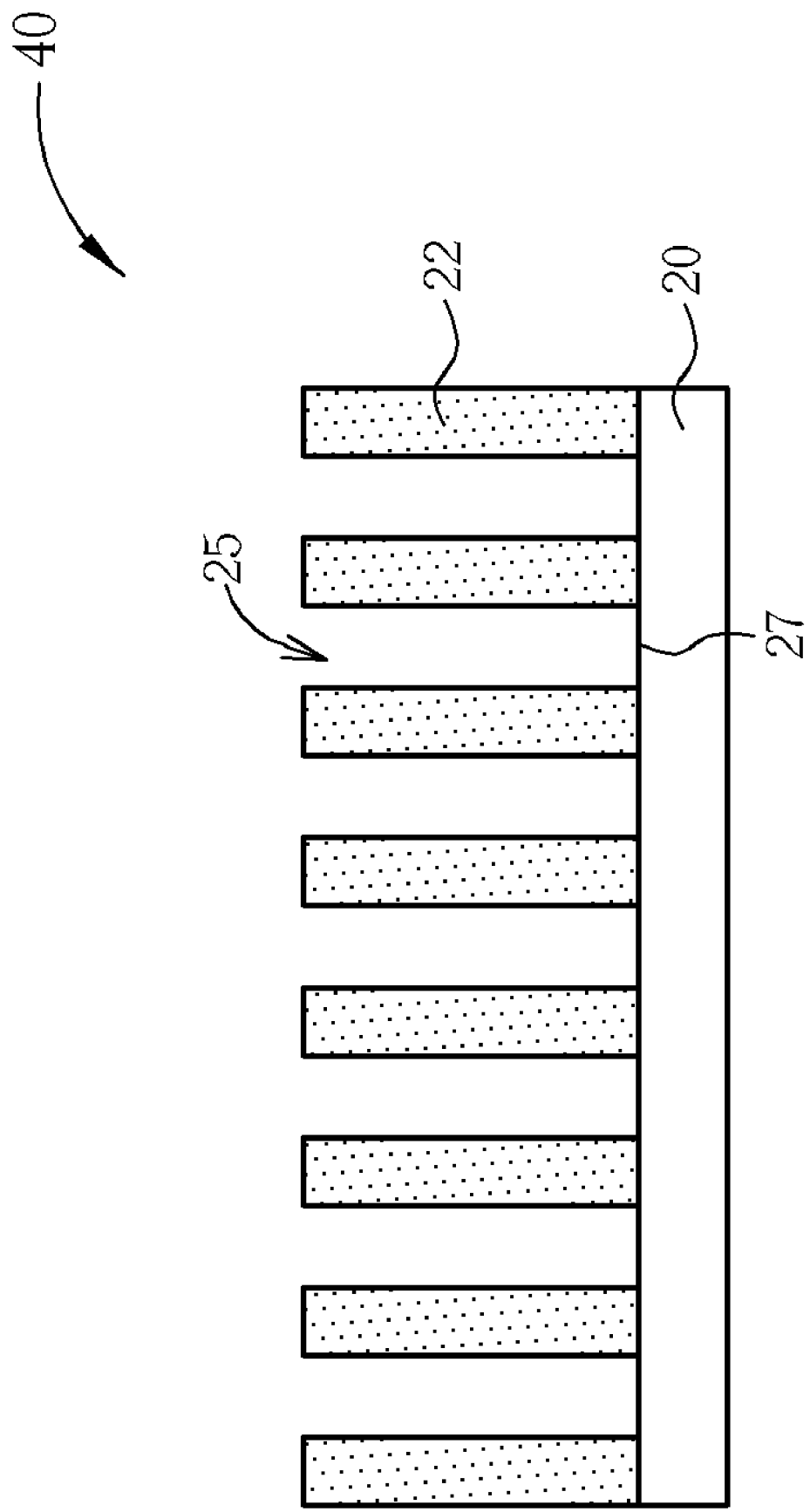

Please refer to FIGS. 2 to 4. FIGS. 2 to 4 show one embodiment of the method of manufacturing an imprinting template using a semiconductor manufacturing process according to the present invention. First, a substrate 20 is provided. The substrate 20 may be for example a silicon substrate. An oxide layer 22 is formed on the substrate 20. The oxide layer 22 has a thickness, for example, in a range of 1000 angstroms to 8000 angstroms. The oxide layer 22 may comprise silicon dioxide and may be formed by, for example, a thermal oxidation process or a chemical vapor deposition process. In the present invention, the oxide layer is used not due to the dielectric properties, but the easy formation and low cost for the oxide layer to form a template pattern using a semiconductor manufacturing process. Thereafter, a photoresist 24 is formed on the oxide layer 22.

Please refer to FIG. 3, a pattern having a plurality of contact hole-like openings 23 is formed on the photoresist layer 24 by a microlithography and etch process. In case of manufacturing photonic crystals, the openings may be further regularly and periodically arranged in a pitch of micro dimension, sub-micro dimension, or nano dimension. Referring to FIG. 4, the oxide layer 22 is etched through the openings 23 by an etch method, such as dry etch or wet etch, to form a plurality of pillar-shaped holes 25. Thereafter, the photoresist layer 24 is removed; thereby an imprinting template 40 having a plurality of pillar-shaped holes 25 is formed.

Figure 5:
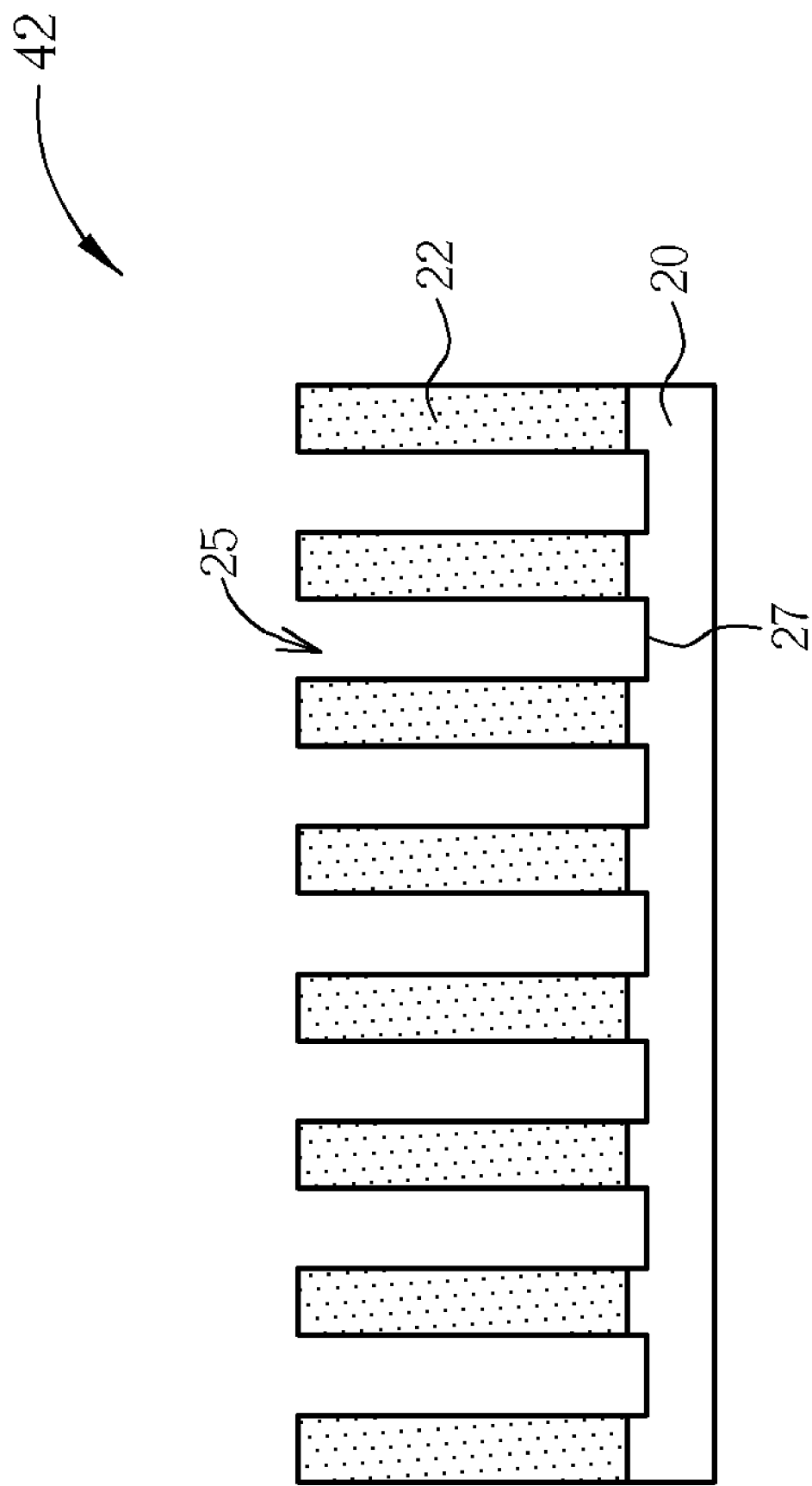
FIGS. 5 and 6 show two embodiments of the imprinting template according to the present invention.

The imprinting template according to the present invention may have various aspects, for example, the bottoms 27 of the pillar-shaped holes 25 may be higher or lower than the top surface of the substrate 20 or just on the top surface of the substrate 20. As shown in FIG. 4, the bottoms 27 of the pillar-shaped holes 25 are located just on the top surface of the substrate 20, that is, when the oxide layer 22 is etched to form the pillar-shaped holes, the oxide layer 22 is etched to form holes throughout the oxide layer 22 till the top surface of the substrate 20, or the substrate 20 may serve as an etch stop layer. Alternatively, the depth of the oxide layer etched is either shallower or deeper, and the bottoms of the pillar-shaped holes 25 are higher or lower than the top surface of the substrate 20. For example, the imprinting template 42 shown in FIG. 5 is formed by etching the oxide layer 22 and followed by partly etching the substrate 20 to form the holes, such that the bottoms 27 of the pillar-shaped holes 25 may lower than the top surface of the substrate 20. The imprinting template 44 shown in FIG. 6 has the holes formed by etching but not thoroughly penetrating the oxide layer 22, such that the bottoms 27 may higher than the top surface of the substrate 20.

Furthermore, a cap layer (not shown) may be further formed to overlay the oxide layer 22, and the photoresist layer 24 is formed on the cap layer. The cap layer may serve as, for example, a hard mask comprising silicon nitride, for etching the oxide layer 22 using a hard mask method. Furthermore, the step of forming the oxide layer 22 may be paused, and an intermediate layer (not shown) is further formed on the paused oxide layer. Thereafter, the oxide layer 22 is continued being formed on the intermediate layer. Furthermore, before forming the oxide layer 22, a lining layer (not shown) may be further formed on the substrate 20. Thereafter, the oxide layer 22 is formed on the lining layer.

When the oxide layer 22 is etched to form the pillar-shaped holes 25, if an intermediate layer or a lining layer is present, the etching may be stopped at the intermediate layer or the lining layer, that is, the bottoms 27 of the pillar-shaped holes 25 may be located on the intermediate layer or the lining layer. Therefore, the intermediate layer or the lining layer may serve as an etch stop layer and comprise, for example, silicon nitride.

The template used for making nanoscaled devices such as photonic crystal structures usually have a very small size, and thus, it is not easy to form the pillar-shaped holes having a deep profile. An etching resistive layer-silicon-containing layer-photoresist layer, tri-layer, structure is preferably used in the method of manufacturing an imprinting template using a semiconductor manufacturing process according to the present invention to perform the etch of the oxide layer to form the pillar-shaped holes. Please refer to FIGS. 7 and 8. An etching resistive layer 26 is formed on the oxide layer 22, a silicon-containing layer 28 is formed on the etching resistive layer 26, and the photoresist layer 24 is formed on the silicon-containing layer 28. This method of forming pillar-shaped holes is similar to a method of forming contact holes disclosed in U.S. patent application Ser. No. 11/530,886 (copending, filed on Sep. 11, 2006, with the same assignee of the present application). The specification is incorporated herein for reference.

Figure 7:
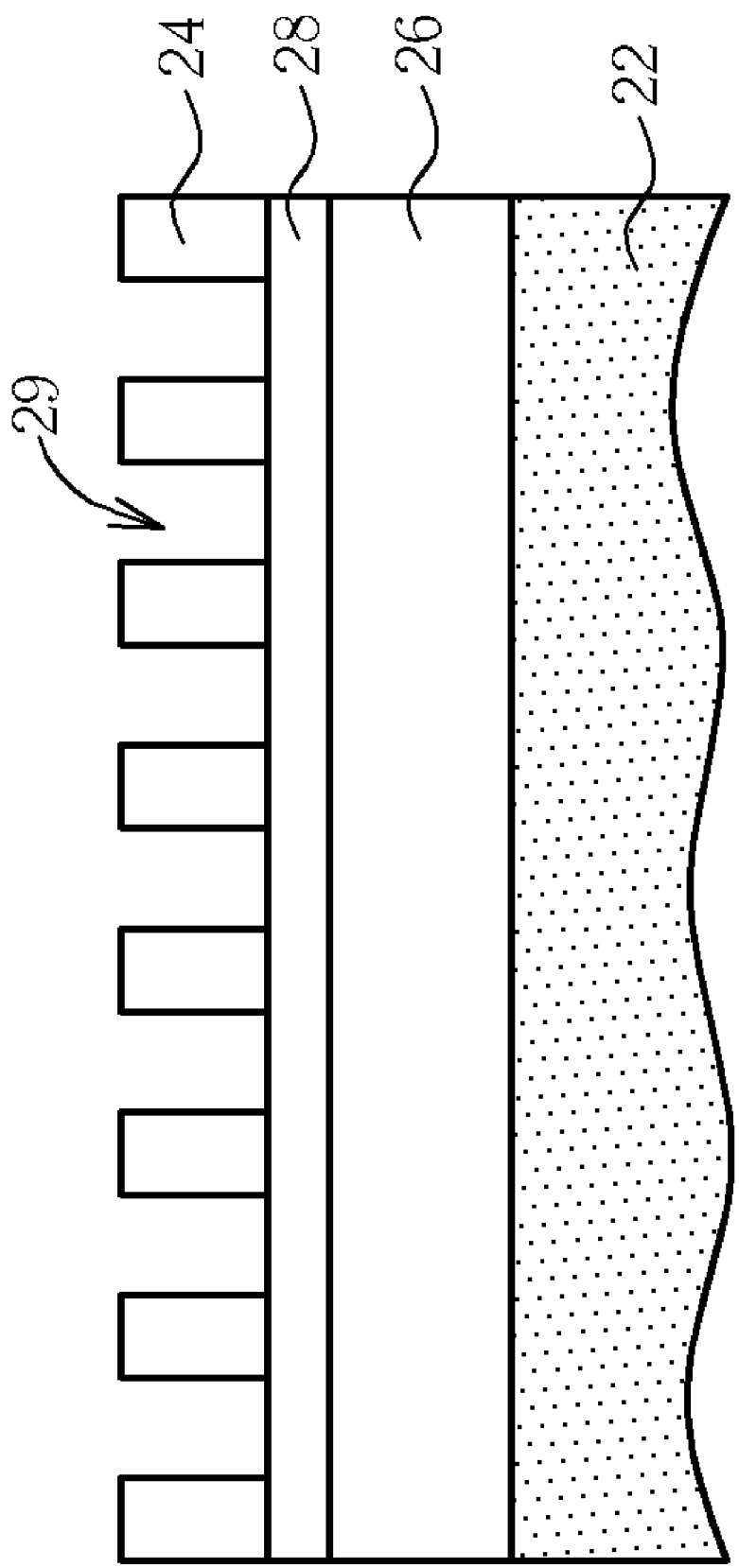
FIGS. 7 and 8 show the etching resistive layer-silicon-containing layer-photoresist layer tri-layer structure used in the method of manufacturing an imprinting template using a semiconductor manufacturing process according to the present invention to perform the etch of the oxide layer to form the pillar-shaped holes.

As shown in FIG. 7, an etching resistive layer 26 is formed on the oxide layer 22. The etching resistive layer 26 may comprise novolac resin or i-line photoresist material and preferably has a thickness of about 1000-2500 angstroms. For example, when the i-line photoresist is used, it may be coated on the oxide layer 22 by using ordinarily photoresist coating procedure and then baked.

Subsequently, a silicon-containing layer 28 is formed on the etching resistive layer 26 to serve as a hard mask. The silicon-containing layer 28 may comprise, for example, organosilicon polymers or polysilane comprising at least a chromophore group and a crosslinkable group with silicon content of about 5 wt % to 30 wt %, and preferably 10 wt % to 15 wt %. In other cases, the silicon-containing layer 28 may further comprise a crosslinking agent. The silicon-containing layer 28 beneath the photoresist layer may exhibit an anti-reflective effect during exposure and a high etch selectivity relative to the underlying etching resistive layer 26 by adjustment of silicon content. The silicon-containing layer 28 may have a thickness of, for example, about 300 to 1500 angstroms, and may be coated on the etching resistive layer 26 using spin-on coating methods. After coating, a post baking process may be carried out. In another embodiment, the etching resistive layer 26 is not baked immediately after coating, but the etching resistive layer 26 and the silicon-containing layer 28 are baked together in one step.

A photoresist layer 24 is coated on the silicon-containing layer 28. The photoresist layer 24 may be for example ArF resist or 193 nm resist and have a thickness of 1200 angstroms to 3000 angstroms.

Figure 8:
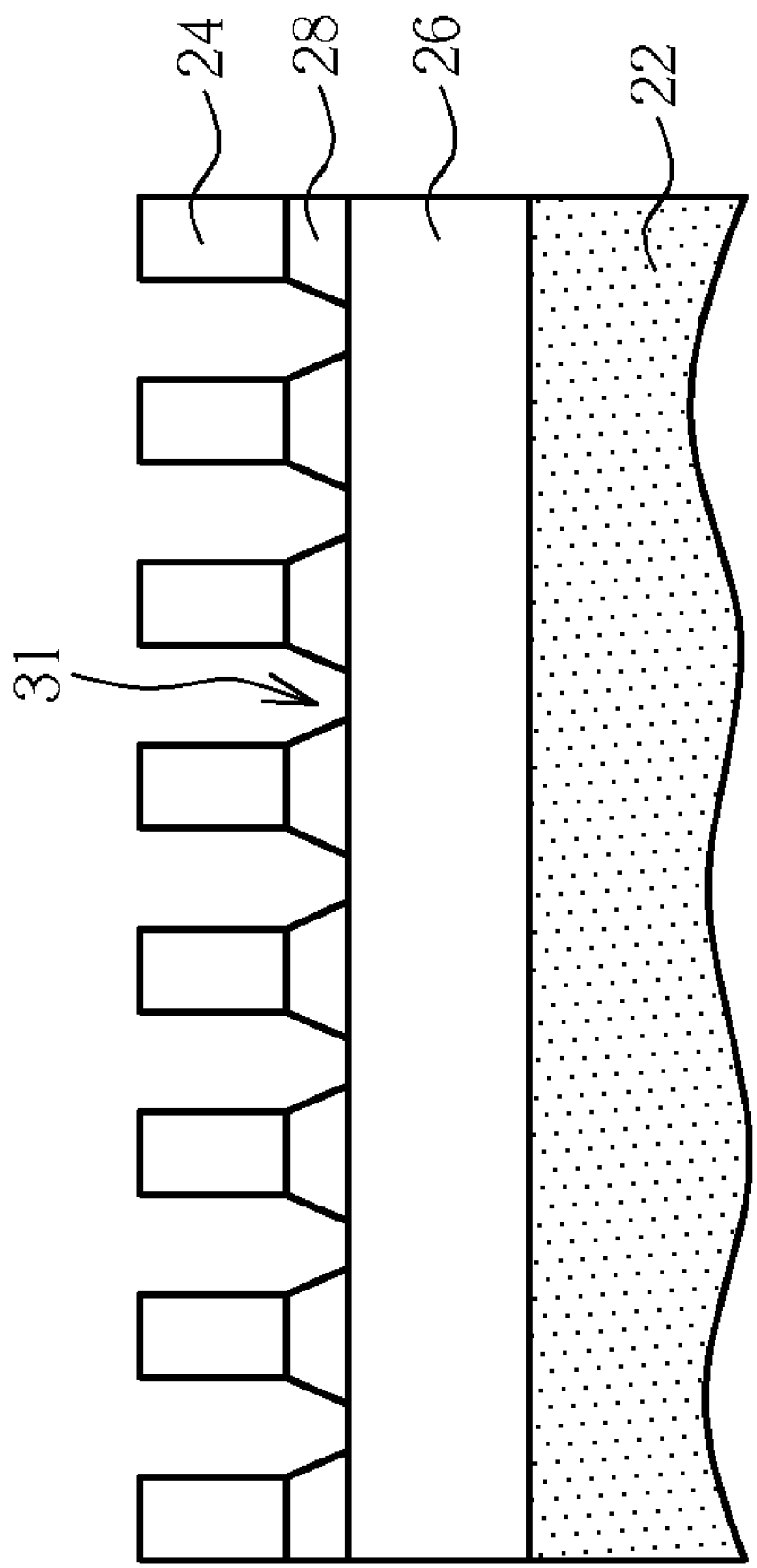

A lithography process, including typical exposure and development processes, is then performed to create openings 29 in the photoresist layer 24. The opening 29 defines the pattern, shape, and position of the pillar-shaped holes to be formed in the underlying oxide layer 22. The openings 29 expose a portion of the surface of the silicon-containing layer 28 and have an after development inspect critical dimension (ADICD), for example, of about 65 nm. Subsequently, as shown in FIG. 8, using the patterned photoresist layer 24 as an etching hard mask, a dry etching process is carried out to transfer the hole pattern defined by the openings 29 into the underlying silicon-containing layer 28, thereby forming openings 31 exposing a portion of the etching resistive layer 26. The aforesaid dry etching process may use an etchant gas comprising, for example, tetrafluoromethane ($CF_4$) and hydrogen-containing fluoromethane such as fluoromethane ($CH_3F$), difluoromethane ($CH_2F_2$), or trifluoromethane ($CHF_3$).

For example, the dry etching conditions when using $CF_4$/$CHF_3$ as an etchant gas for etching the silicon-containing layer 28 may include: a pressure of about 80 millitorrs to 150 millitorrs, preferably 120 millitorrs; a bias power of 500 W to 600 W; a $CF_4$ gas flow rate of about 200 sccm to 300 sccm, preferably 200 sccm; a $CHF_3$ gas flow rate of about 5 sccm to 30 sccm, preferably 15 sccm; and a duration of about 30 seconds to 100 seconds, preferably 35 seconds.

As shown in FIG. 8, the openings 31 has a tapered sidewall, such that the dimension at the bottoms of the openings 31 is smaller than the after etch inspect critical dimension (AEICD) of the openings 29.

Thereafter, the pillar-shaped hole pattern defined by the openings 31 is transferred to the etching resistive layer 26 by, for example, a dry etching process. The dry etching conditions for etching the etching resistive layer 26 may include: a pressure of about 10 millitorrs; a bias power of 700 W to 300 W; a gas mixture of $CO/O_2/N_2$ with respective flow rate of 250/30/200 sccm; and a duration of about 60 seconds. Thereafter, the oxide layer 22 is etched using the etching resistive layer 26 as a mask to form pillar-shaped holes 25 in the oxide layer 22 with a size of about the bottom AEICD, for example, 45 nm. The bottoms 27 of the pillar-shaped holes 25 may be higher or lower than the top surface of the substrate 20 or just on the top surface of the substrate 20. Thereafter, the photoresist layer 24 is removed and the etching resistive layer 26 and the silicon-containing layer 28 are removed, to obtain an imprinting template having a plurality of pillar-shaped holes.

Figure 6:
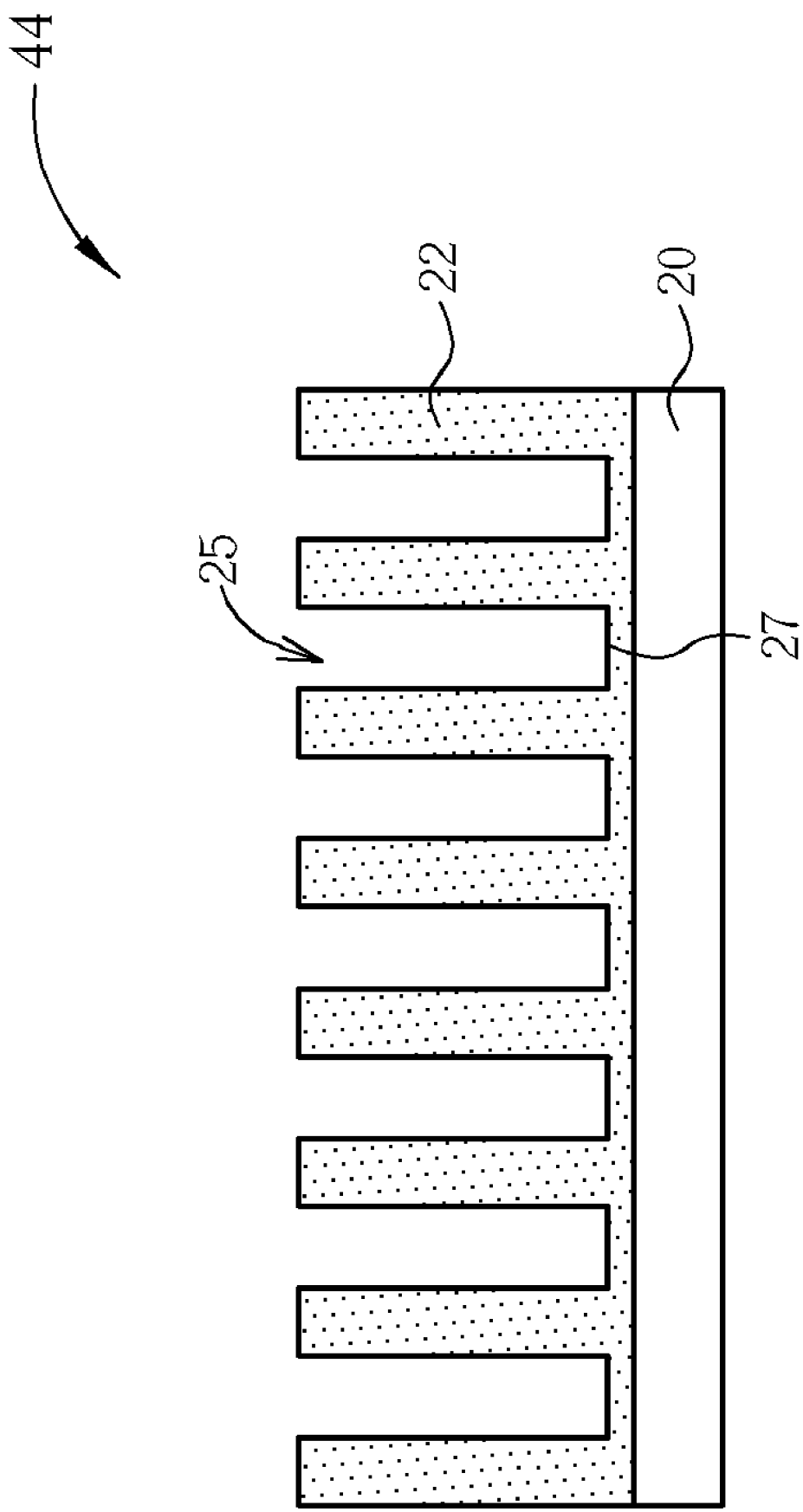
Figure 9:
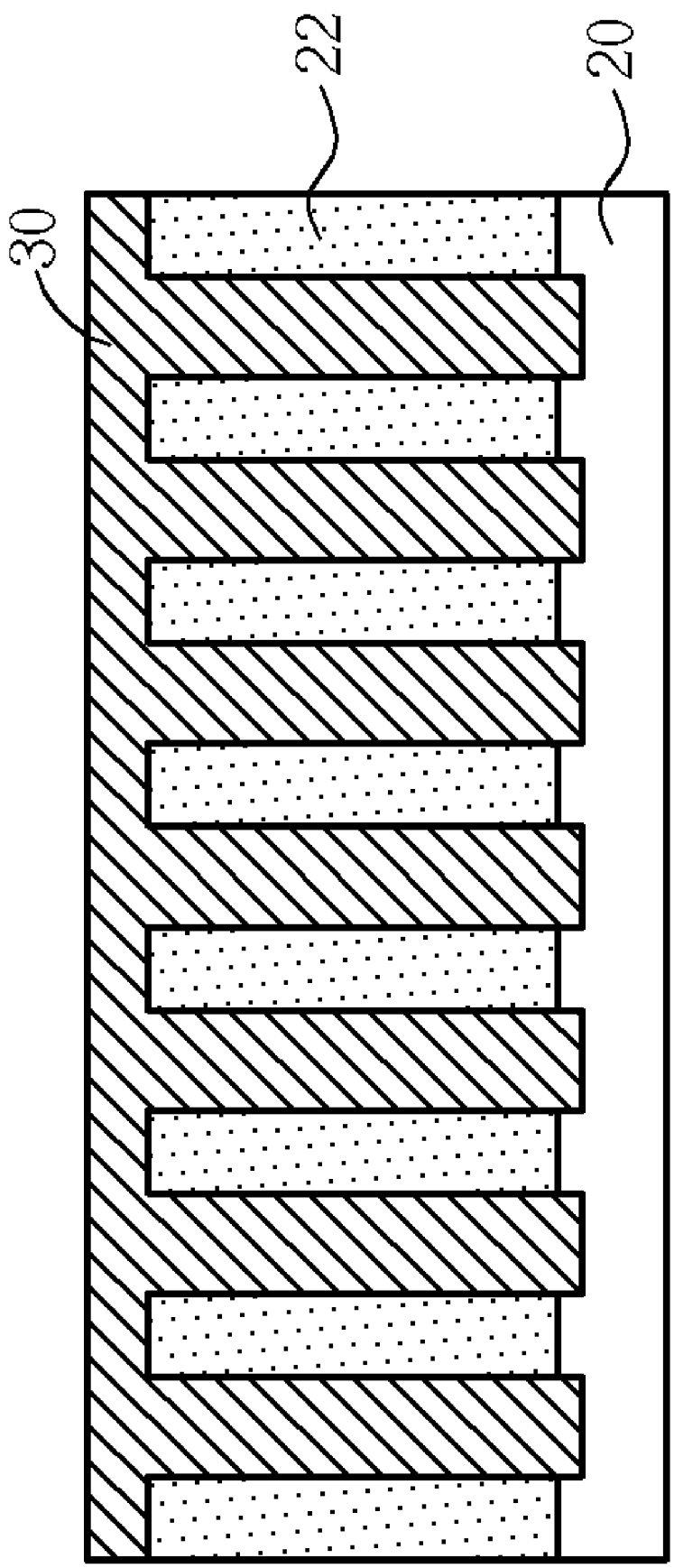
FIGS. 9 to 11 show another embodiment of the method of manufacturing an imprinting template using a semiconductor manufacturing process according to the present invention.
Figure 10:
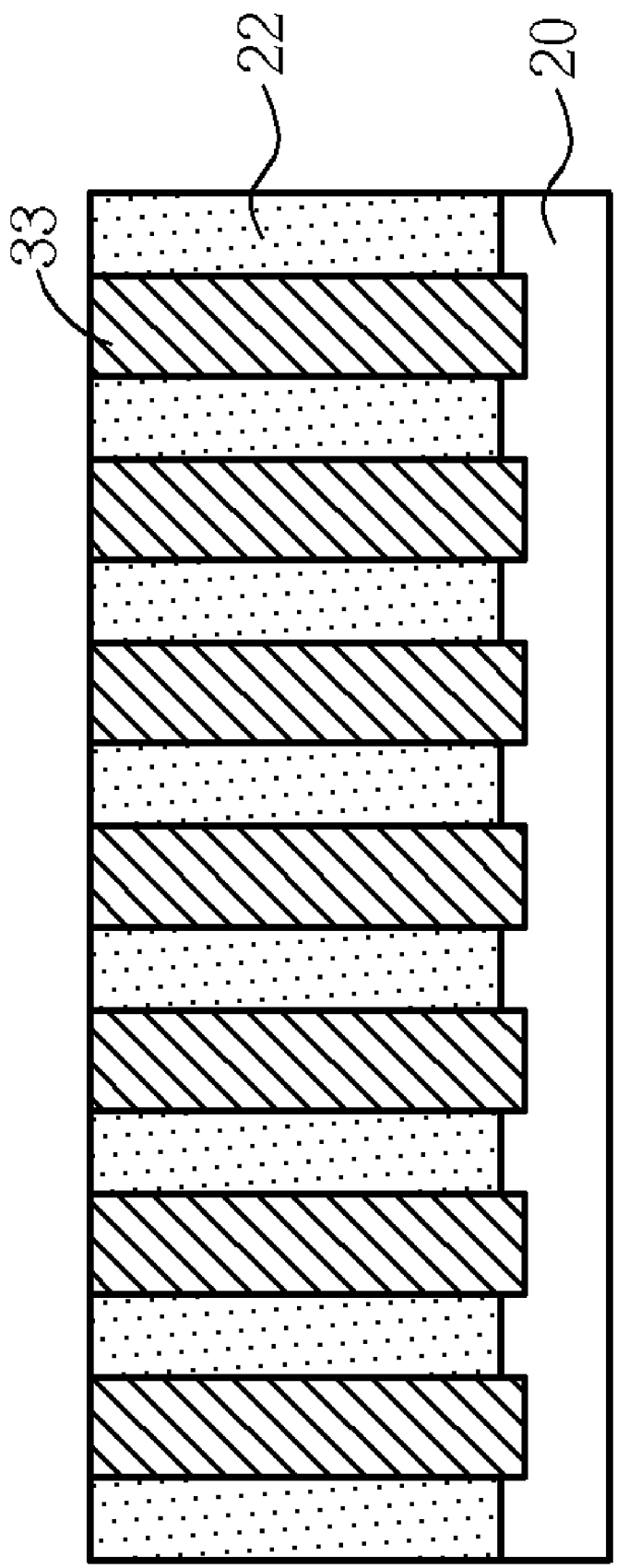
Figure 11:
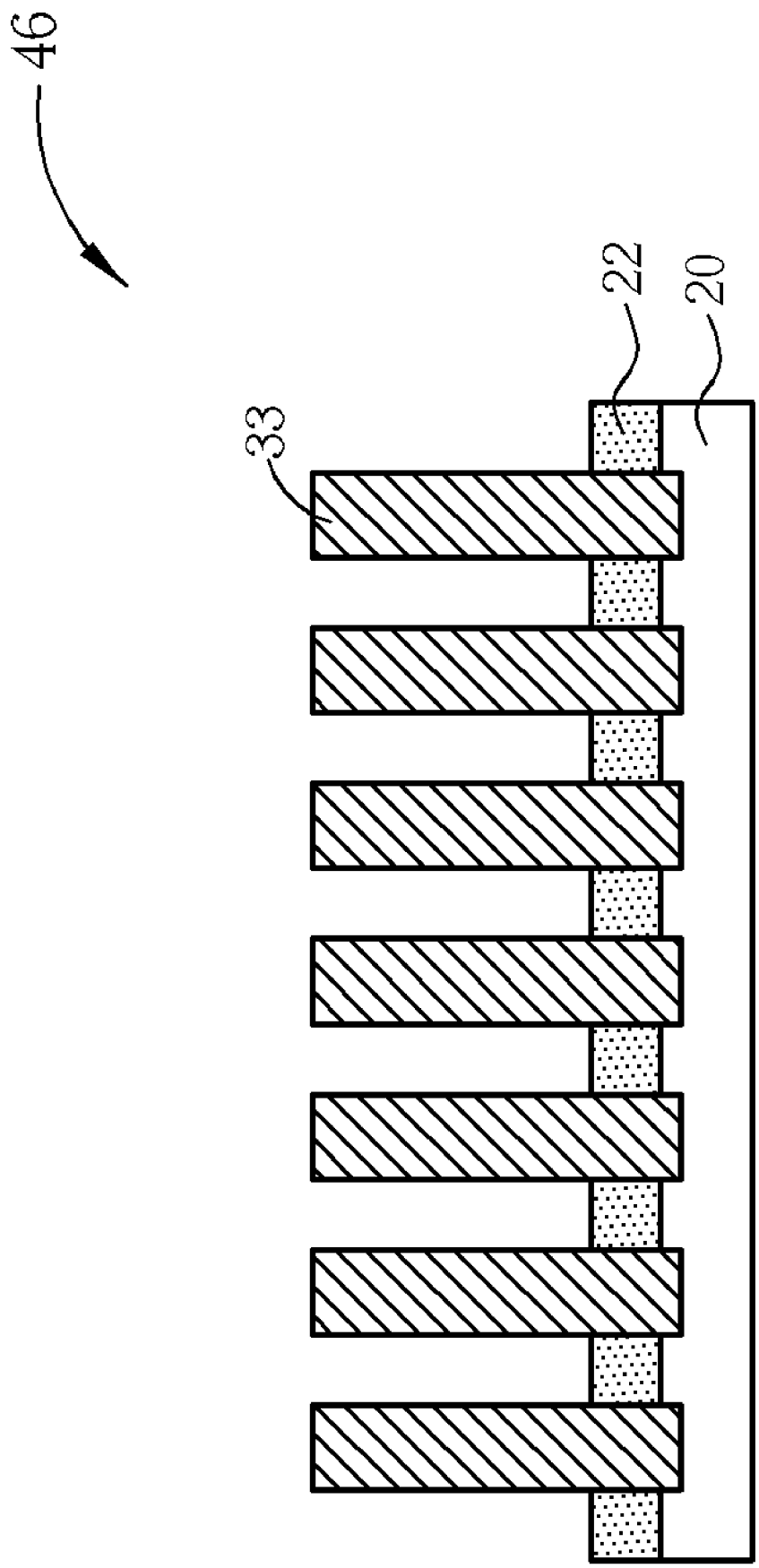

In the embodiments according to the present invention described above, the imprinting templates having a plurality of pillar-shaped holes are obtained. Imprinted articles obtained using such imprinting templates have a plurality of pillar-shaped extrusions. Another embodiment according to the present invention to manufacture an imprinting template having a plurality of pillar-shaped extrusions is describe hereinafter. Please refer to FIGS. 9 to 11, showing another embodiment of the method of manufacturing an imprinting template using a semiconductor manufacturing process according to the present invention. First, the substrate 20 is provided, as shown in FIG. 2. An oxide layer 22 having a thickness, for example, in a range of 1000 angstroms to 8000 angstroms, is formed on the substrate 20. A photoresist 24 is formed on the oxide layer 22. Also as shown in FIG. 3, a pattern having a plurality of contact hole-like openings 23 is formed on the photoresist layer 24 by a microlithography and etch process. The oxide layer 22 is etched through the openings 23 to form a plurality of pillar-shaped holes 25. Thereafter, the photoresist layer 24 is removed, and the resulting imprinting template may be as shown in FIG. 4, 5, or 6, depending on the depth of the oxide layer etched. The etching resistive layer-silicon-containing layer-photoresist layer, trilayer, structure also can be used to form the pillar-shaped holes in the oxide layer, as shown in FIGS. 7 and 8. That is, an etching resistive layer 26 is formed on the oxide layer 22, a silicon-containing layer 28 is formed on the etching resistive layer 26, and the photoresist layer 24 is formed on the silicon-containing layer 28. After the pillar-shaped holes are formed in the oxide layer 22, the photoresist layer 24, the etching resistive layer 26, and the silicon-containing layer 28 are removed.

As described in the above, the substrate 20 may comprise, for example, silicon. The oxide layer 22 may comprise, for example, silicon dioxide and be formed by, for example, a thermal oxidation process or a chemical vapor deposition process. A cap layer may be further formed on the oxide layer 22. The formation of the oxide layer 22 may be paused, and an intermediate layer may be further formed on the paused oxide layer, and the formation of the oxide layer is continued to form the subsequent oxide layer on the intermediate layer. A lining layer may be formed in advance on the substrate 20 before the oxide layer 22 is formed, and, thereafter, the oxide layer is formed on the oxide layer 22. In case the imprinting plate for making a photonic crystal is to be formed, the openings 23 may be further regularly and periodically arranged in a pitch of micro dimension, sub-micro dimension, or nano dimension, such that the pillar-shaped holes 25 formed is also regularly and periodically arranged.

Next, as shown in FIG. 9, a material layer 30 is filled up the pillar-shaped holes 25. The material layer preferably has an etching selectivity to the oxide layer 22 for subsequent removal of the oxide layer conveniently using an etching process. The material layer is also preferably with certain toughness to preventing the pillars from being broken. The material, used for the via or plug contact, for example, metal or polysilicon, is considered as suitable material and may be filled into the pillar-shaped holes conveniently using a semiconductor damascene process. The metal may be for example tungsten, copper, aluminum, or an alloy thereof. The method for filling the material layer into the pillar-shaped holes may be a chemical vapor deposition, sputtering deposition, electroplating, or the like. Before the material layer is filled up the pillar-shaped holes 25, a barrier layer (not shown) may be formed in advance on the surface of the wall and the bottoms of the pillar-shaped holes. Thereafter, the surplus part of the material layer is removed by, for example, a chemical mechanic polishing process to planarize the material layer 30 to have a height as same as the height of the oxide 22 to expose the layer 22, as shown in FIG. 10. Thus, a pillar 33 is formed in each of the pillar-shaped holes 25. Preferably, the bottoms of the pillar-shaped holes 25 are lower than the original surface of the substrate 20, such that the pillars 33 can be considered as being inlaid in the substrate 20.

Next, please refer to FIG. 11. An upper part of the remaining oxide layer is removed by etching (such as dry etching or wet etching), and a small amount of lower part of the oxide layer 22 is remained. That is, most part of the pillar 33 is exposed, thereby forming an imprinting template having a plurality of pillars. The lower part of the pillars 33 are still inlaid in the remained oxide layer 22, thus forming an imprinting template 46 having a plurality of protruding pillars. If the pillar-shaped holes 25 are arranged in a regular periodical form, the resulting pillars 33 also present in a regular periodical arrangement. The device obtained by imprinting using the imprinting template 46 having a plurality of extruding pillars will have a pattern of a plurality of holes.

Furthermore, after the imprinting template 46 having a plurality of pillar extrusions is formed, a coating may be further coated on the imprinting template overall for strengthening the pillars. The coating material may be for example titanium nitride, titanium metal, tantalum nitride, or tantalum metal, and the coating can be performed using a known technology.

As shown in FIGS. 9 to 11, the bottoms of the pillars are inlaid in the substrate 20, but not limited thereto. As mentioned above, when etching the oxide layer, the bottoms of the pillar-shaped holes formed may be above the substrate 20, lower than the top surface of the substrate 20, or on the top surface of the substrate 20. Therefore, the bottoms of the pillars 33 formed by filling up the pillar-shaped holes 25 may be also above the substrate 20, lower than the top surface of the substrate 20, or on the top surface of the substrate 20. The height of the finally remained oxide layer depends on the desired one, to serve a main function of fixation of the pillars 33 to the imprinting plate.

Figure 12:
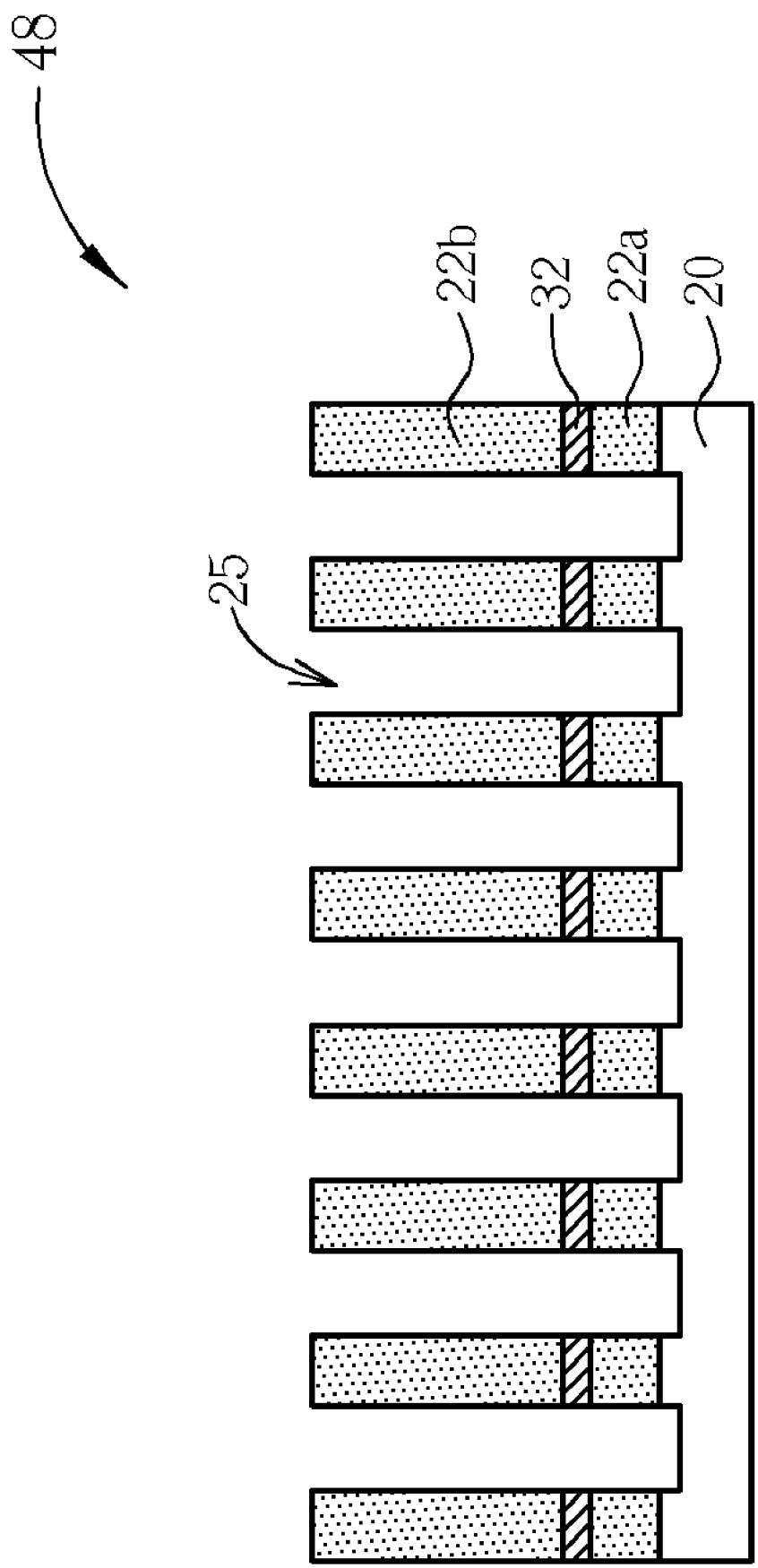
FIGS. 12 to 14 show further another embodiment of the method of manufacturing an imprinting template using a semiconductor manufacturing process according to the present invention.
Figure 13:
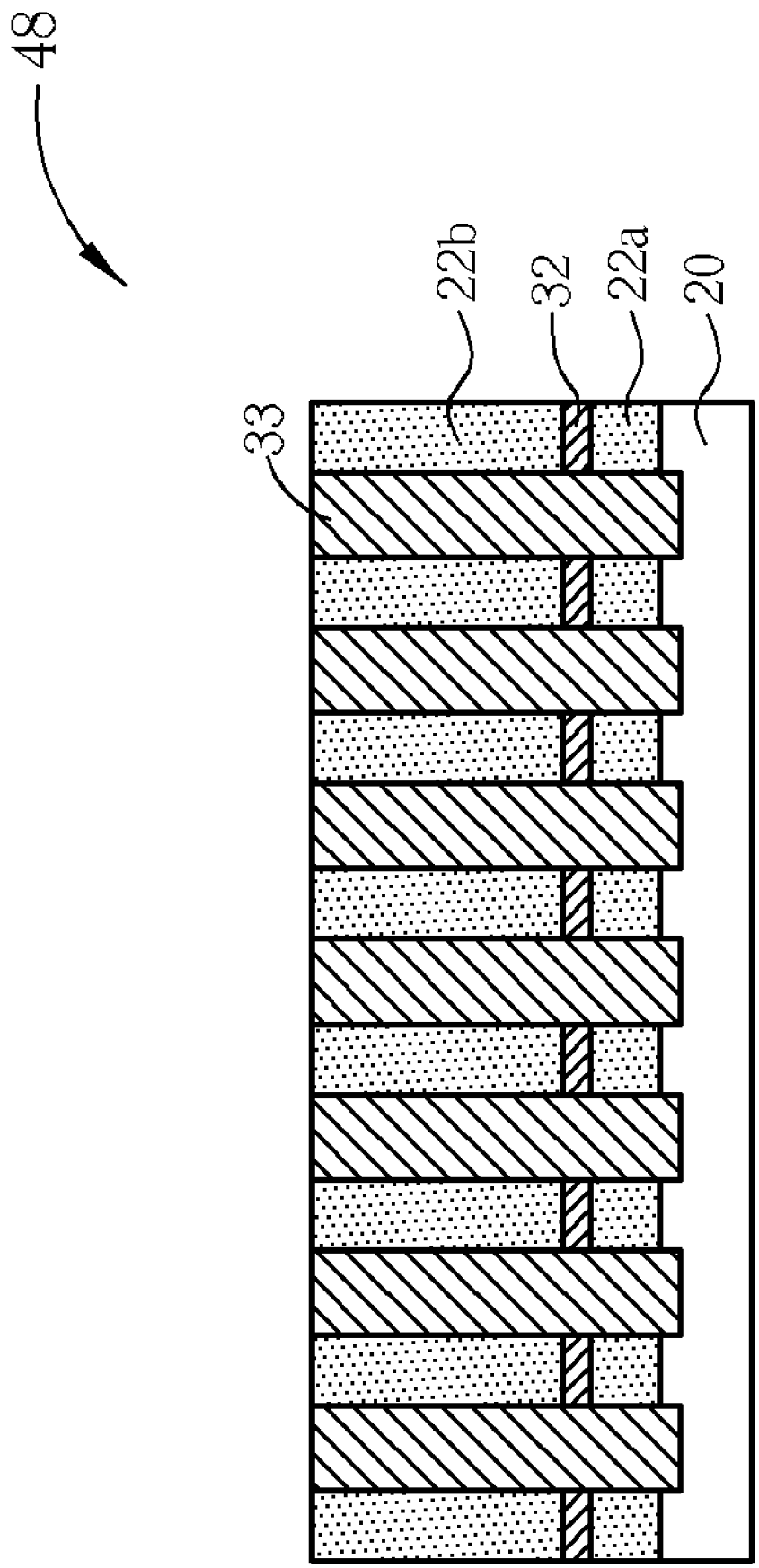
Figure 14:
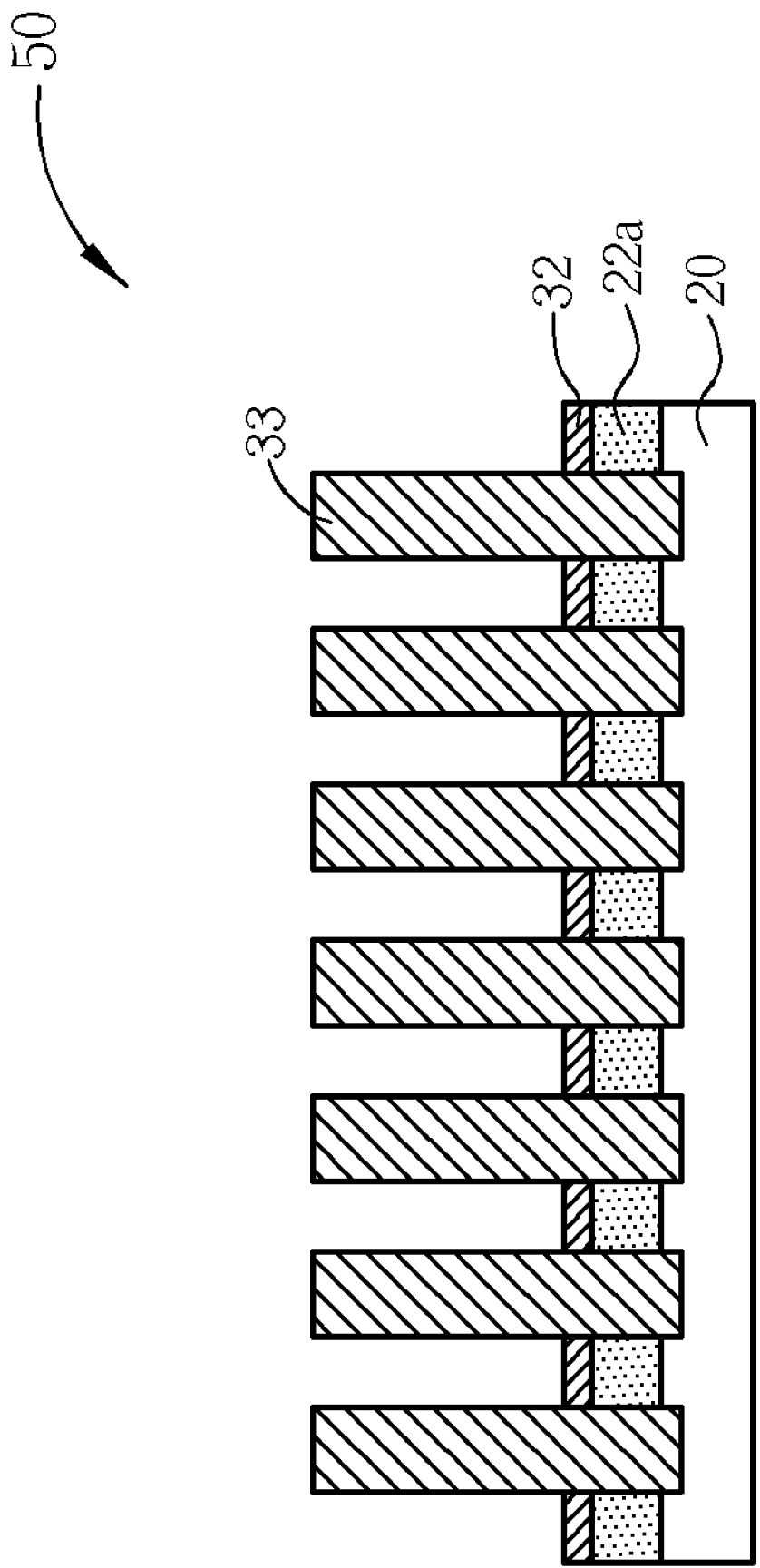

As described above, during the step of forming the oxide layer 22, the formation of the oxide layer 22 may be paused, and an intermediate layer is further formed on the paused oxide layer. Thereafter, the oxide layer 22 is continued being formed on the intermediate layer. FIG. 12 shows a plurality of pillar-shaped holes 25 formed after the oxide layer is etched. The oxide layer has a layer 22a and a layer 22b with an intermediate layer 32 therebetween. The resulted article obtained so far may be taken as an imprinting template 48, or a subsequent process for manufacturing an imprinting template having pillars may be further performed. FIG. 13 shows the situation of the pillar 33 formed by filling a material layer into the pillar-shaped holes followed by polishing to expose the oxide layer 22b. The intermediate layer 32 may serve as an etch stop layer and comprise, for example, silicon nitride, but not limited thereto, with a thickness of about 400 angstroms to 1500 angstroms. FIG. 14 shows that the upper layer (layer 22b) of the remained oxide layer 22 is etched and removed. The intermediate layer 32 serves as an etch stop layer, thereby layer 22a and the intermediate layer 32 are remained after etching, to form an imprinting template 50 having extruding pillars. The height of the retained oxide layer and the intermediate layer is as desired and not particularly limited, with a main purpose to help the pillar be firmer on the imprinting template.

Figure 15:
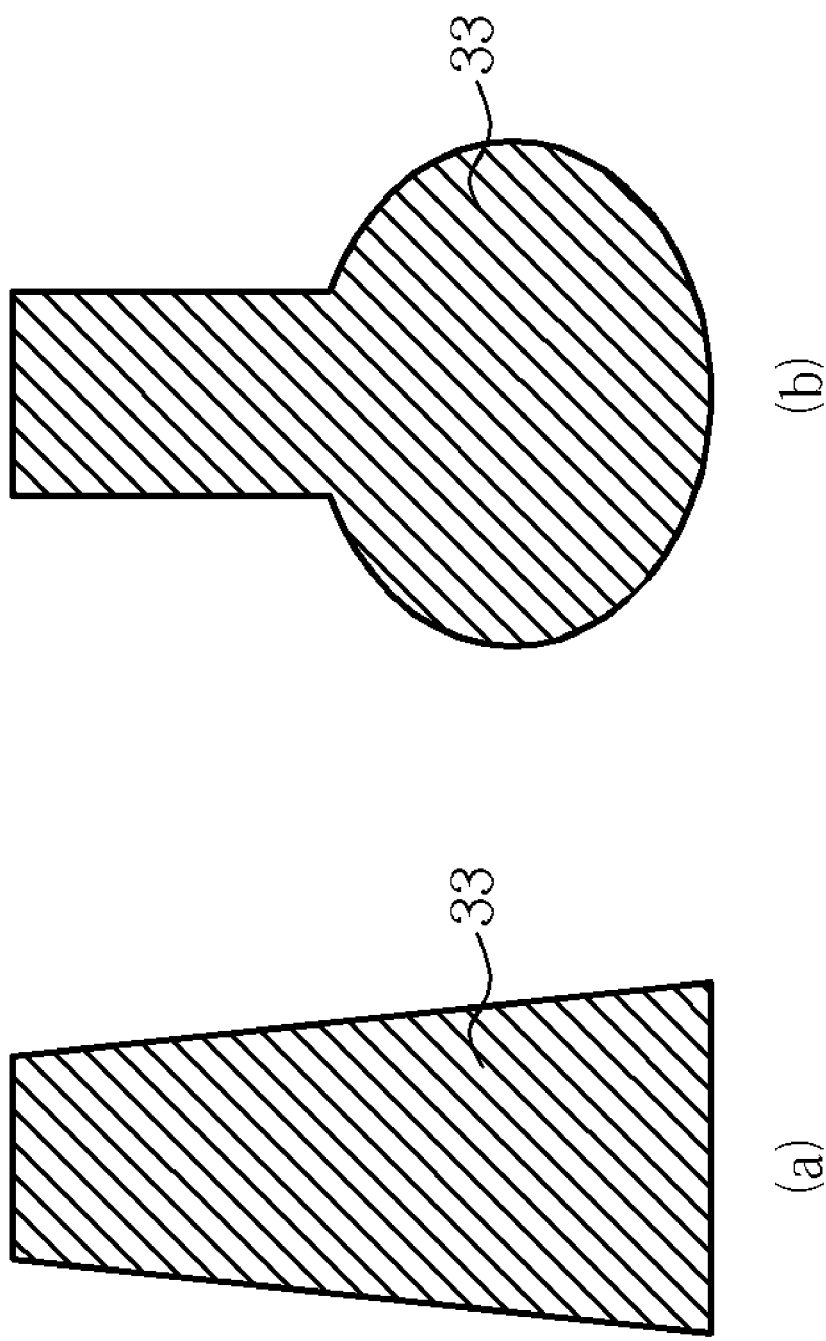
FIG. 15 shows examples of the shape for the pillar.

The pillar 33 may be in any shape with accordance to the shape of the pillar-shaped holes 25, and not limited to a shape of column. If the pillar 33 is made in a shape of pillar with a lower portion wider than an upper portion or in a shape of pillar with a bulged lower portion respectively as shown by (a) or (b) in FIG. 15, it would be firmer.

A releasing agent layer may be further coated on the imprinting template manufactured according to the present invention to help the imprinted articles being released from the imprinting template.

In an experimental example of the present invention, the oxide layer is etched by using an etching resistive layer-silicon-containing layer-photoresist layer (tri-layer) structure to form a plurality of pillar-shaped holes. For example, when an etching resistive layer having a thickness of 1800 angstrom, a silicon-containing layer having a thickness of 800 angstrom, and a photoresist layer having a thickness of 2200 angstrom on thickness are used, an imprinting template having a plurality of pillar-shaped holes arranged in a pitch of 220 nm by utilizing a 65-nanometer semiconductor manufacturing process. The ADICD is 95 nm, and the AEICD is 75 nm. Or an imprinting template having a plurality of pillar-shaped holes arranged in a pitch of 180 nm by utilizing a 45-nanometer semiconductor manufacturing process. The ADICD is 80 nm, and the AEICD is 55 nm.

Figure 16:
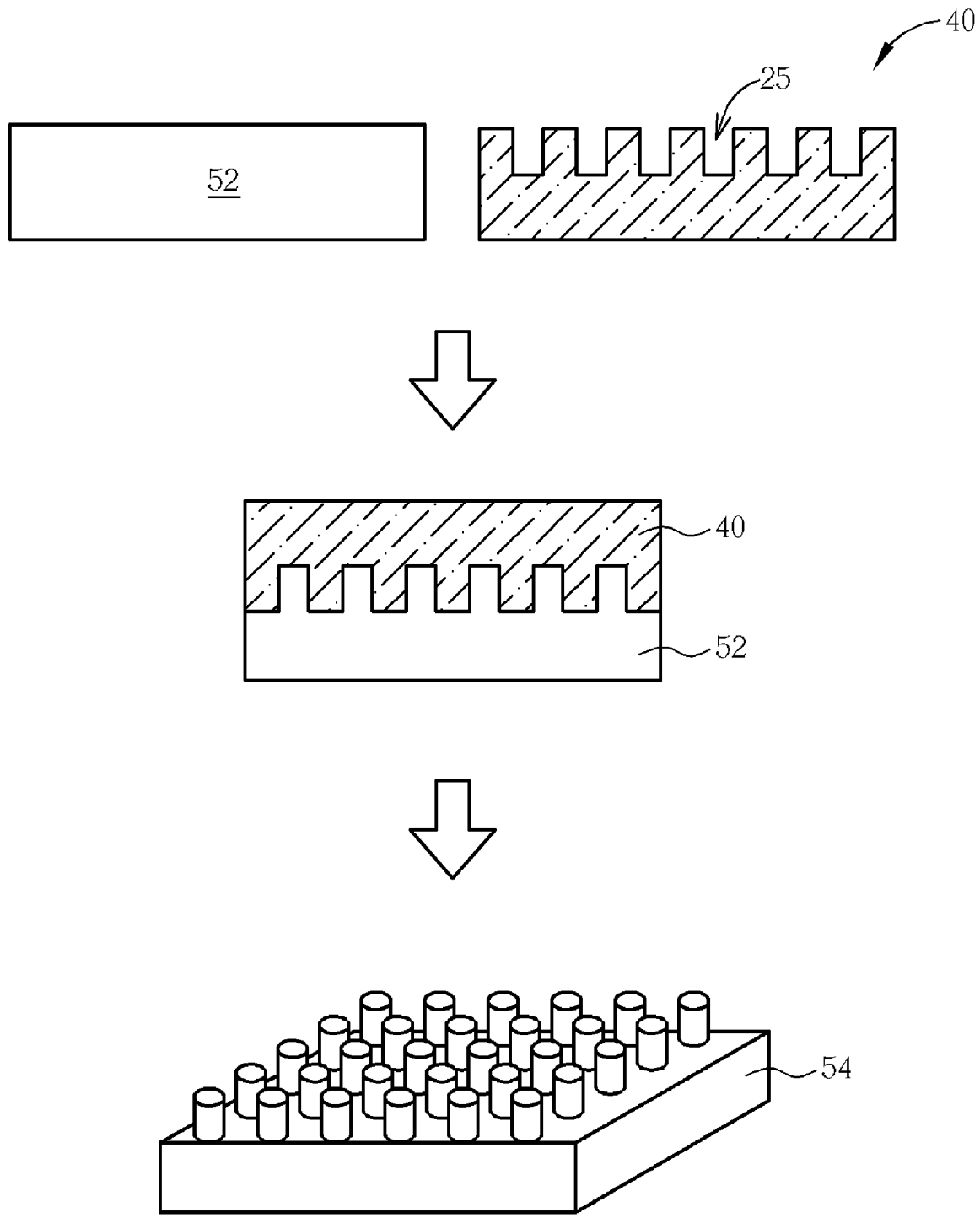
FIG. 16 shows a flow chart illustrating a use of the imprinting template according to the present invention to obtain an imprinted article.

FIG. 16 shows a flow chart illustrating a use of the imprinting template according to the present invention to obtain an imprinted article. An imprinting template 40 having a plurality of pillar-shaped holes 25 is utilized to imprint the material to be imprinted 52; thereby the pattern on the imprinting template 40 is transferred onto the material to be imprinted 52. After the material to be imprinted 52 having the pattern thereon is cured or hardened, an imprinted article 54 is obtained. In this embodiment, the imprinted article 54 has a pattern with a plurality of protruding pillars.

Alternatively, in the embodiments mentioned above, a silicon substrate may be used instead of the substrate and the oxide layer stacked together, to make the imprinting templates using the similar methods as aforesaid. For example, in an embodiment, first, a silicon substrate is provided, and a photoresist layer as aforesaid is formed on the silicon substrate. Thereafter, a pattern having a plurality of contact hole-like openings is formed on the photoresist layer using the method as aforesaid. A plurality of pillar-shaped holes are formed by etching the silicon substrate through the openings. Finally, the photoresist layer is removed, and thereby an imprinting template having a plurality of pillar-shaped holes is formed. Also, for example, in another embodiment, first, a silicon substrate is provided, and a photoresist layer as aforesaid is formed on the silicon substrate. Thereafter, a pattern having a plurality of contact hole-like openings is formed on the photoresist layer using the method as aforesaid. A plurality of pillar-shaped holes are formed by etching the silicon substrate through the openings. The photoresist layer is removed, and a material layer is filled into the pillar-shaped holes. Finally, partly removing the silicon substrate to expose an upper part of the material layer to form a plurality of pillars, thereby forming an imprinting template.

All combinations and sub-combinations of the above-described features also belong to the present invention. All combinations and sub-combinations of the above-described features also belong to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an imprinting template using a semiconductor manufacturing process, comprising:

providing a substrate;

forming an oxide layer having a thickness in a range of 1000 angstroms to 8000 angstroms on the substrate;

forming a photoresist layer on the oxide layer;

performing a microlithography and etch process on the photoresist layer to form a pattern having a plurality of contact hole-like openings;

etching the oxide layer through the openings to form a plurality of pillar-shaped holes;

removing the photoresist layer;

forming a barrier layer on surface of walls and bottoms of the pillar-shaped holes;

depositing a material layer to fill up the pillar-shaped holes;

performing a chemical mechanic polishing process to partly remove the material layer, thereby the height of the material layer is the same as the height of the oxide layer to expose the oxide layer; and partly removing the oxide layer to expose an upper part of the material layer to form a plurality of pillars, thereby forming an imprinting template.

2. The method of claim 1, wherein the pillars are regularly and periodically arranged in a pitch of micro dimension, sub-micro dimension, or nano dimension.

3. The method of claim 1, wherein the substrate comprises silicon.

4. The method of claim 1, wherein the oxide layer comprises silicon dioxide.

5. The method of claim 1, wherein the oxide layer is formed by a thermal oxidation process or a chemical vapor deposition process.

6. The method of claim 1, further comprising forming a cap layer over the oxide layer.

7. The method of claim 1, wherein etching the oxide layer is stopped on the surface of the substrate or further etching the substrate.

8. The method of claim 1, before forming the oxide layer, further comprising forming a lining layer on the substrate, and forming the oxide layer on the lining layer.

9. The method of claim 8, wherein etching the oxide layer is stopped on the lining layer.

10. The method of claim 1, wherein the step of forming the oxide layer is paused, an intermediate layer is further formed on the paused oxide layer, and the step of forming the oxide layer is continued on the intermediate layer.

11. The method of claim 10, wherein partly etching the oxide layer is to remove the portion of the oxide layer from the top till the intermediate layer.

12. The method of claim 1, before forming the photoresist layer and after forming the oxide layer, further comprising forming an etching resistive layer on the oxide layer and forming a silicon-containing layer on the etching resistive layer, such that the photoresist layer is formed on the silicon-containing layer.

13. The method of claim 12, after removing the photoresist layer, further comprising removing the etching resistive layer and the silicon-containing layer.

14. The method of claim 1, wherein the pillars have a lower portion wider than an upper portion.

15. The method of claim 1, wherein the pillars have a bulged lower portion.

16. The method of claim 1, wherein the material layer comprises one selected from the group consisting of tungsten, copper, aluminum, an alloy thereof, and polysilicon.

* * * * *